(12) United States Patent
Poeppelman et al.

(10) Patent No.: US 8,151,172 B2
(45) Date of Patent: Apr. 3, 2012

(54) ADJUSTABLE ERROR-CORRECTION FOR A REED SOLOMON ENCODER/DECODER

(75) Inventors: Alan D. Poeppelman, Fort Collins, CO (US); Kevin T. Campbell, Windsor, CO (US)

(73) Assignee: LSI Corporation, Milpitas, CA (US)

( * ) Notice: Subject to any disclaimer, the term of this patent is extended or adjusted under 35 U.S.C. 154(b) by 936 days.

(21) Appl. No.: 12/171,002

(22) Filed: Jul. 10, 2008

(65) Prior Publication Data

US 2010/0011277 A1   Jan. 14, 2010

(51) Int. Cl.
*H03M 13/00*   (2006.01)
(52) U.S. Cl. ......................... 714/784; 714/756
(58) Field of Classification Search .................... 714/784
See application file for complete search history.

(56) References Cited

U.S. PATENT DOCUMENTS

| | | | | |
|---|---|---|---|---|
| 5,444,719 A | * | 8/1995 | Cox et al. ...................... | 714/769 |
| 6,061,826 A | * | 5/2000 | Thirumoorthy et al. ...... | 714/784 |
| 6,209,115 B1 | * | 3/2001 | Truong et al. .................. | 714/784 |
| 7,117,425 B2 | * | 10/2006 | Fredrickson et al. .......... | 714/785 |
| 7,206,987 B2 | * | 4/2007 | Roth et al. ..................... | 714/755 |
| 7,793,196 B2 | * | 9/2010 | Jiang et al. ..................... | 714/784 |
| 2004/0221220 A1 | * | 11/2004 | Roth et al. ..................... | 714/758 |
| 2007/0011592 A1 | * | 1/2007 | Fredrickson et al. .......... | 714/785 |
| 2008/0065966 A1 | * | 3/2008 | Jiang et al. ..................... | 714/781 |
| 2009/0070651 A1 | * | 3/2009 | Diggs et al. .................... | 714/752 |

* cited by examiner

*Primary Examiner* — Scott Baderman
*Assistant Examiner* — Kamini Patel
(74) *Attorney, Agent, or Firm* — Duft Bornsen & Fishman LLP

(57) ABSTRACT

Methods and structure described herein provide for reducing the overall delay of an RS encoder/decoder without changing the essential functionality of the RS encoder/decoder. In one embodiment, a cascade module reduces the combinatorial logical delay by reducing the total number of logical devices. In doing so, the cascade module couples encoder/decoder slices into blocks. A first block of the encoder/decoder slices is selectively operable in parallel with a second block of encoder/decoder slices. The number of encoder/decoder blocks is less than the overall number of encoder/decoder slices. The cascade module may also include a switch that selects encoder/decoder slices as needed, thereby providing for the implementation of the RS encoder/decoder with fewer logical devices.

20 Claims, 6 Drawing Sheets

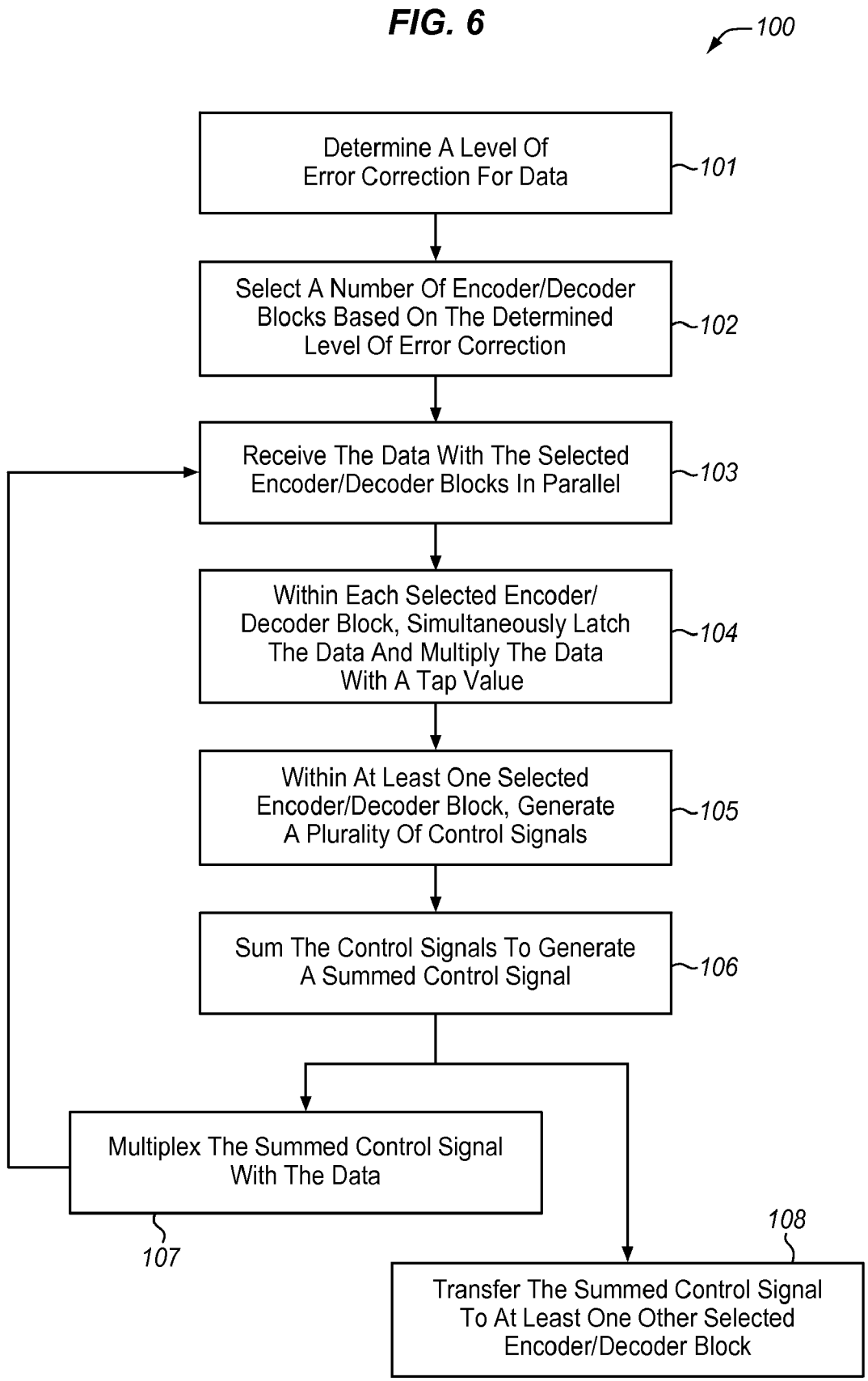

ADJUSTABLE ERROR-CORRECTION FOR A REED SOLOMON ENCODER/DECODER

BACKGROUND

1. Field of the Invention

Generally, the invention relates to error correction systems, and more particularly to a composite encoder/syndrome generator for generating both check symbols and error syndromes.

2. Discussion of the Related Art

In order to adjust error correction capability when using a Reed-Solomon (RS) code, it is necessary that this capability be adjustable in both the encoder and decoder. FIG. 1 illustrates an algebraic error correction system embodying a prior art RS encoder/decoder that includes a composite encoder/syndrome generator circuit 30. The circuit 30 generates check symbols that are appended to uncorrupted input data supplied via bus 31 and transmitted via bus 32 to a channel 45 that is subject to noise. The composite encoder/syndrome generator circuit 30 also computes error syndromes from potentially noise-corrupted data received via bus 33 from the channel 45.

As illustrated, the circuit 30 comprises a plurality of fixed multipliers 51 with respective preselected multiplier values (i.e., tap weights) of $a^0$, $a^1$, $a^2$ . . . $a^{2t-1}$, latches 34a, 34b, 34c . . . 34n, and adders 35a, 35b, 35c . . . 35n, where "n" is an integer greater than one. Each multiplier 51, latch 34, and associated adder 35 constitutes a multiplier module 50. Each multiplier module 50 is associated with an adder 36 (i.e., adders 36a, 36b . . . 36n-1), an AND gate 37 (i.e., AND gates 37a, 37b, 37c . . . 37n), and an AND gate (i.e., AND gates 38a, 38b, 38c . . . 38n). The AND gates 38 each have one input that is constantly on (i.e., having a logical "1" input). The error correction system also includes multiplexors (MUXs) 39A, 39B, 39C, a controller 40, and a programmable ECC power selection circuit 41.

To correct "t" symbols in error, 2t check symbols and 2t error syndromes are generated. The number of check symbols that are generated depends upon the programmed value of "r" which determines the number of multiplier modules 50 that are activated in the circuit 30. For example, if r=2, all control lines to the left of 2t-2 (i.e., r>2t-2 and r>2t-1) are deactivated. Accordingly, only the rightmost multiplier modules 50 with the fixed multipliers ($a^{2t-2}$, $a^{2t-1}$) receive incoming data.

In operation, to encode uncorrupted incoming data, a controller 40 (via signal line 42) causes the switch 43 to be biased to its upper position. The controller 40, via signal line 44, also conditions the MUX 39A to transmit uncorrupted incoming data from bus 31 via the switch 43 to bus 32. From bus 32, the data is transferred to a MUX 39B. The MUX 39B causes the data to be transferred to the channel 45. Data from the bus 32 is also concurrently transferred to the adders 35, latches 34, and multipliers 51 of the enabled multiplier modules 50 for computing check symbols, the values of which are stored in their respective latches 34.

When transmission of data via the bus 32 to the channel 45 is complete, the controller 40 transfers a control signal to the signal line 42, which causes the switch 43 to be pulled to its lower position thereby disconnecting the bus 32 from the uncorrupted data. Meanwhile, the programmable ECC power selection circuit 41 is conditioned by a preselected value for r from 0 to 2t-1 in line 46 to provide corresponding outputs via corresponding control lines labeled r>1 . . . r>2t-1. The signal line 42 transfers a control signal to all AND gates 38a through 38n. Again, if r=2, only the two rightmost AND gates 38n-1 and 38n are activated to feed the check bytes stored in the latches 34n-1 through 34n of the respective multiplier modules 50 sequentially starting from the rightmost multiplier module 50 under control of a clock (not shown) and as permitted by the AND gate 38n. The MUX 39C is conditioned by the signal in the control line 44 to cause these check bytes to be transmitted to the channel 45 and appended to the uncorrupted input data previously transmitted via the switch 43 in upper position. Note that the AND 38n is necessary to isolate latch 34n from the MUX 39C unless line 42 is on.

For decoding, the MUXs 39A and 39B are conditioned by the control signal via the control line 44 from the controller 40 to pass the data to be decoded from the bus 33 via the switch 43 in upper position and then via the bus 32 to the buffer 47. Also during encoding, the data is transferred to the various multiplier modules 50 to generate error syndromes, which are stored in the respective latches 34a . . . 34n.

After the data to be decoded has been transmitted to the buffer 47, the controller 40 activates the control line 42 to cause the error syndromes stored in the latches 34c . . . 38n to be shifted out through the MUX 39C to the decoder 48. With the selection circuit 41 conditioned by the selected value of r to deactivate all of the control lines to the left of 2t-2, only the multiplier modules 50 to the right of r>2t-2 are activated.

While the encoder/syndrome generator circuit 30 provides an effective means for Reed Solomon encoding and decoding within a single device, a problem exists in the implementation of the circuit 30. More specifically, the successive feeding of one multiplier module 50 to another has a multiplicative effect on the logical delay. For example, each AND gate 37 has some logical time delay $37_{delay}$ while each adder 36 also has some logical time delay $36_{delay}$. If n multiplier modules 50 are selected, the associated logical delay becomes n ($37_{delay}$+$36_{delay}$). This logical delay becomes increasingly intolerable as the level of error correction encoding/decoding increases.

SUMMARY

The present invention solves the above and other problems, thereby advancing the state of the useful arts, by providing methods and structure for reducing the overall delay of an RS encoder/decoder without changing the essential functionality of the RS encoder/decoder. In one embodiment, a cascade module reduces the combinatorial logical delay by reducing the total number of logical devices. In doing so, the cascade module couples encoder/decoder slices into "blocks". The cascade module may also include a switch, such as a multiplexer, that selects encoder/decoder slices as needed, thereby providing for the implementation of the RS encoder/decoder with fewer logical devices.

In one exemplary embodiment of the invention, an error correction system includes a composite encoder/decoder adapted to generate check symbols for encoding data and error syndromes for correcting corrupted data. The error syndromes are adapted to correct the corrupted data by determining error locations and error values within the corrupted data. The composite encoder/decoder module comprises a plurality of encoder/decoder slices. Each encoder/decoder slice has a preselected static tap weight value for computing the check symbols and the error syndromes. The error correction system also includes a cascade module adapted to couple the plurality of encoder/decoder slices into blocks of encoder/decoder slices. A first block of encoder/decoder slices is selectively operable in parallel with a second block of encoder/decoder slices. The number of encoder/decoder blocks is less than the number of encoder/decoder slices. The error correction system also includes a switch adapted to select at least the first block of encoder/decoder slices to be used in computing the check symbols and the error syndromes.

In another exemplary embodiment of the invention, a method of providing error correction to data includes receiving data with a plurality of encoder/decoder blocks in parallel. Each encoder/decoder block includes a plurality of encoder/decoder slices. The method further includes, within each encoder/decoder slice, latching the data and multiplying the latched data with a preselected static tap weight value to generate check symbols for encoding the data or error syndromes for correcting corrupted data. The method also includes, within each encoder/decoder slice of a first encoder/decoder block, generating a control signal in response to multiplying. The method further includes summing the control signals of the first encoder/decoder block and transferring the summed control signals of the first encoder/decoder block to a second encoder/decoder block to encode the data or correct the corrupted data.

In another exemplary embodiment of the invention, a method of correcting errors in received data and encoding transmit data with error correction includes determining a level of error correction to be provided to the data and selecting encoder/decoder blocks based on the determined level of error correction. Each encoder/decoder block includes a plurality of encoder/decoder slices that are serially coupled to generate check symbols for encoding the transmit data and error syndromes for correcting corrupted received data. The method also includes receiving data with the selected encoder/decoder blocks and generating a summed control signal with a first of the encoder/decoder blocks. The method further includes transferring the summed control signal to a second of the at least two encoder/decoder blocks to encode the transmit data with the check symbols or to correct the corrupted received data with the error syndromes.

In another exemplary embodiment of the invention, a method of correcting errors in received data and encoding transmit data with error correction includes selectively coupling a plurality of encoder/decoder blocks to receive data in parallel. Each encoder/decoder block includes a plurality of encoder/decoder slices. The method also includes, within each encoder/decoder slice, latching the data and multiplying the latched data with a preselected static tap weight value to generate check symbols for encoding the data or error syndromes for correcting corrupted said data. The method also includes generating a control signal with a first encoder/decoder block in response to multiplying the latched data and transferring the control signal to a second encoder/decoder block to encode the transmit data with the check symbols or to correct the corrupted received data with the error syndromes.

BRIEF DESCRIPTION OF THE DRAWINGS

FIG. 6 is a flow chart of a process for providing error correction to data.

DETAILED DESCRIPTION OF THE DRAWINGS

Figure 1:
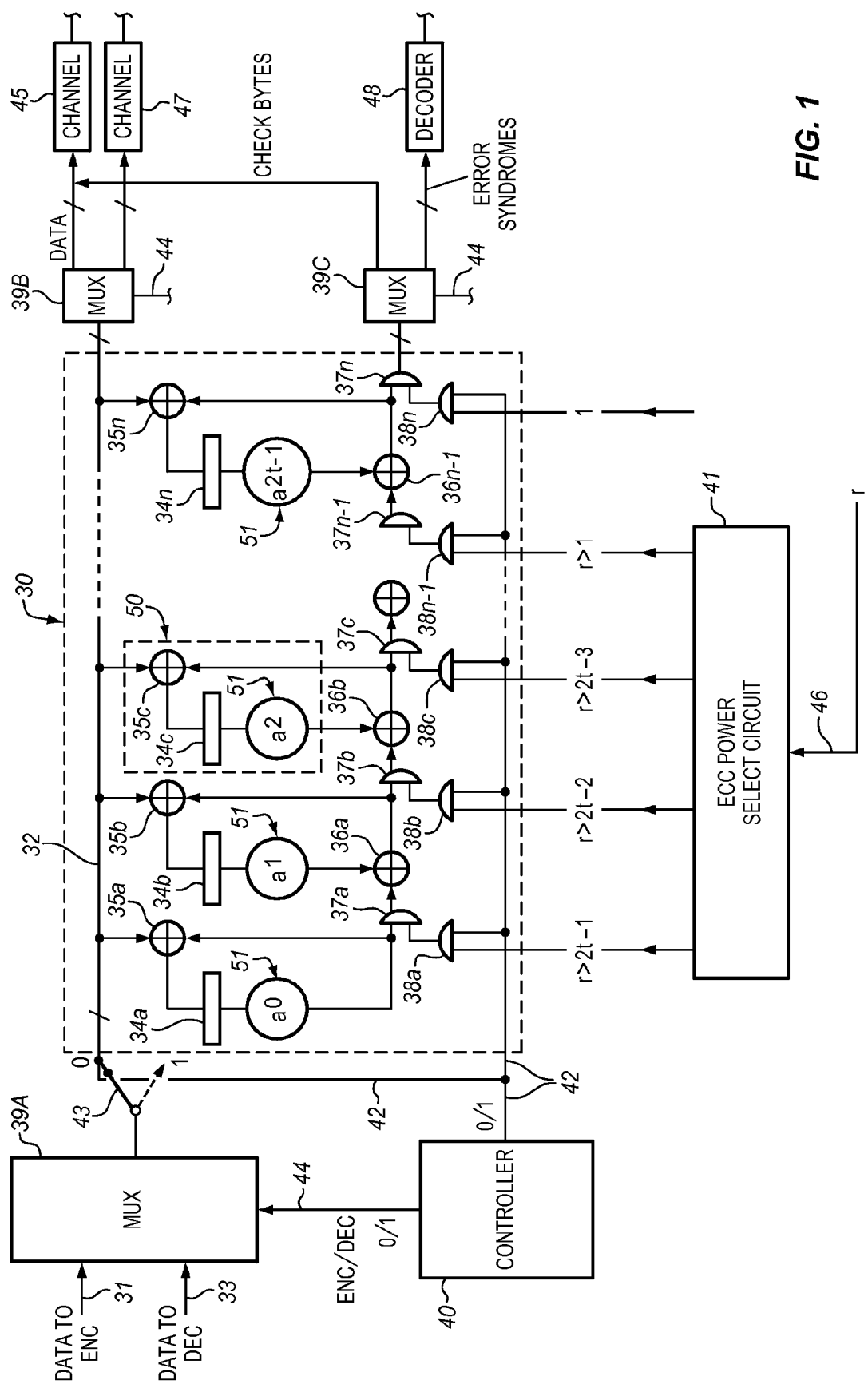
FIG. 1 is a block diagram of an error correction system in the prior art.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

Figure 2:
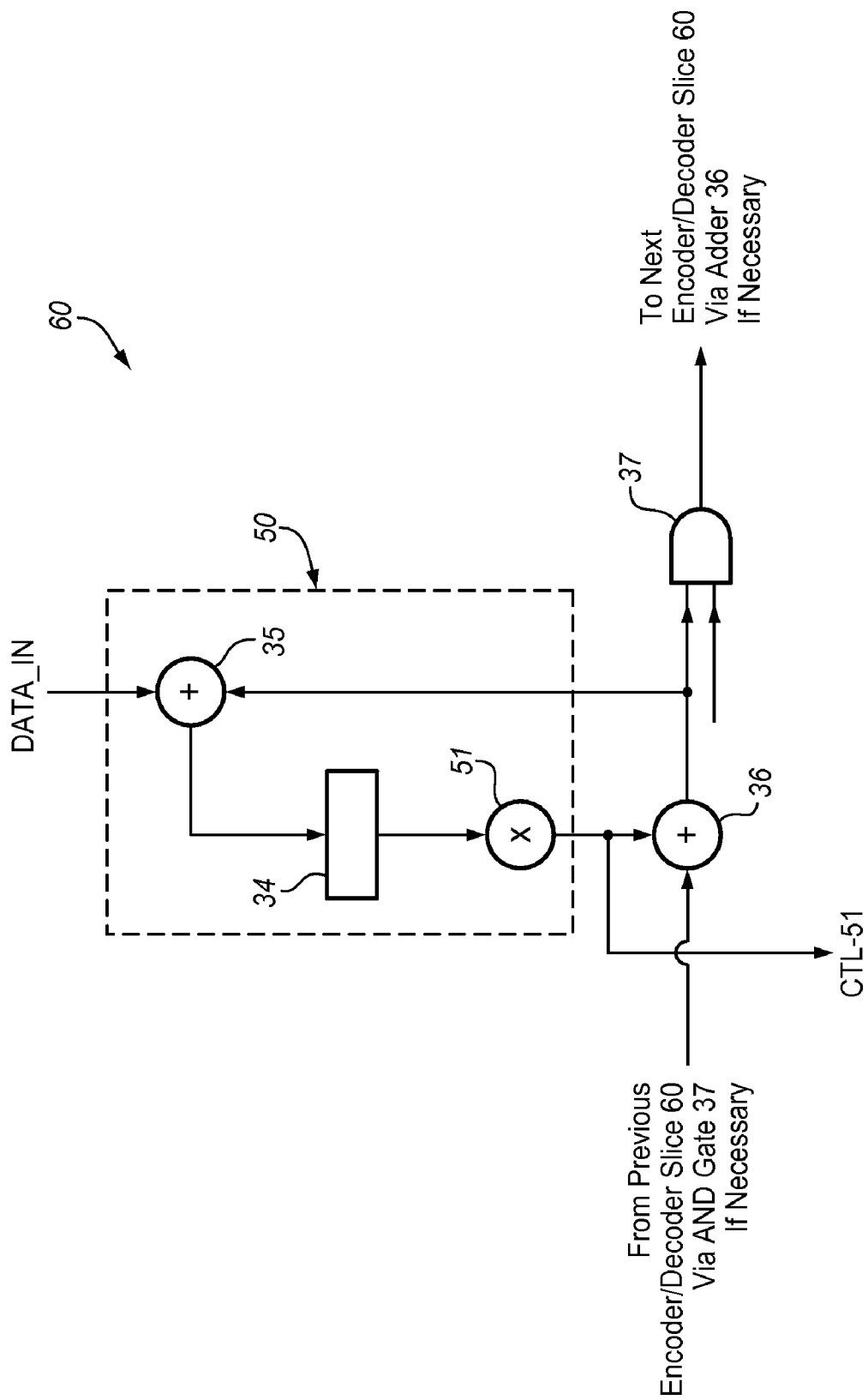
FIG. 2 is a block diagram of an encoder/decoder slice in one exemplary embodiment of the invention.

FIG. 2 is a block diagram of an encoder/decoder slice 60 in one exemplary embodiment of the invention. The encoder/decoder slice 60 of this embodiment includes the adder 35, the latch 34, and the multiplier 51 as described above in the multiplier module 50 of FIG. 1. The multiplier 51 has a preselected static tap weight that is used for computing check symbols and error syndromes. The adder 35 receives a data signal DATA_IN much in the same way that adder 35 of FIG. 1 receives data from bus 32. The encoder/decoder slice 60 also includes an adder 36 and an AND gate 37 also shown in the multiplier module 50 of FIG. 1. Differing from the multiplier module 50 of FIG. 1, however, is the control signal CTL-51 that is generated by the multiplier 51. This control signal CTL-51 output from the multiplier module 50 allows for the encoder/decoder slices 60 to be arranged in blocks that reduce the overall number of logical elements associated with a typical encoder/decoder system. More specifically, the control signal CTL-51 from the multiplier 51 provides for blocks of encoder/decoder slices 60 to process data signal DATA_IN in parallel as opposed to the serial computations of the circuit 30 of FIG. 1. For example, multiple encoder/decoder slices 60 may be coupled in series such that the output of AND gate 37 feeds into a subsequent encoder/decoder slice 60. While the logical delay associated with coupling the encoder/decoder slices 60 in series is similar to that described in FIG. 1, fewer encoder/decoder slices 60 are used to form a single block. The blocks of the encoder/decoder slices 60 are then cascaded such that the encoding or decoding occurs, for the most part, in parallel. Thus, the multiplicative effect of the logical delay is much less than the encoder/syndrome generator circuit 30 of FIG. 1 thereby reducing the overall delay associated with the typical encoder/decoder system. Details will become more apparent in the following descriptions.

Figure 3:
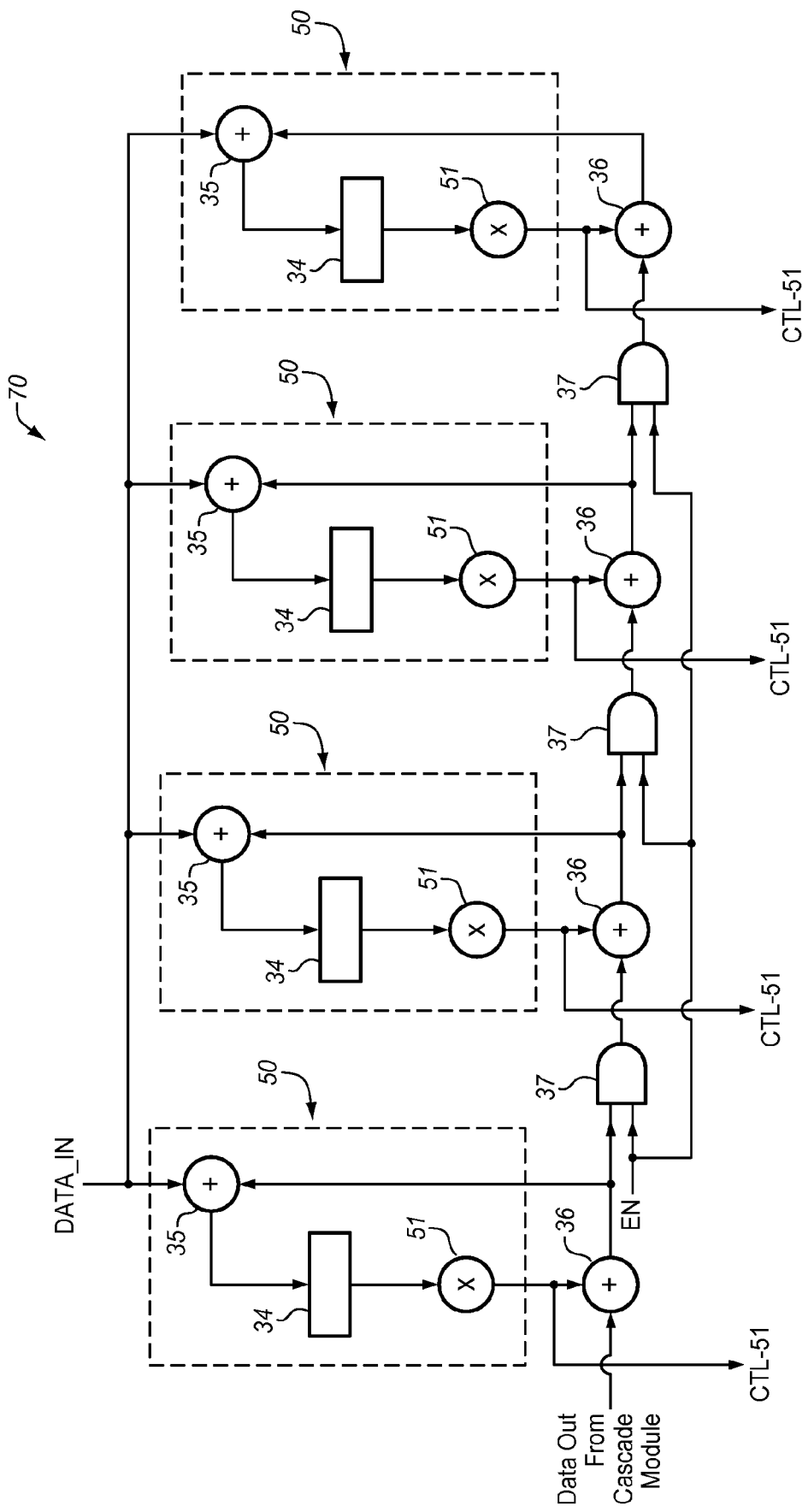
FIG. 3 is a block diagram of a block of encoder/decoder slices in one exemplary embodiment of the invention.

FIG. 3 is a block diagram of a block 70 of encoder/decoder slices 60 in one exemplary embodiment of the invention. Here, the encoder/decoder slices 60 are coupled as a block of four slices. Each encoder/decoder slice 60 receives the data signal DATA_IN with its adder 35 and generates a control signal CTL-51 via its multiplier 51. The block 70 has delays associated with the adders 36 and the AND gates 37 as with the prior art to FIG. 1. However, this block 70 of four encoder/decoder slices 60 is limited to a logical delay of $3 \cdot (37_{delay}) + 4 \cdot (36_{delay})$. The block 70 may then be cascaded with other blocks 70 of encoder/decoder slices 60 that allow an encoder/decoder system to avoid the serial computations and logical delays associated with additional and encoder/decoder slices 60, as mentioned above. That is, when more encoder/decoder slices 60 are required than are present in a single block 70, the encoder/decoder system can implement additional blocks 70 to process the data signal DATA_IN in parallel. This parallel processing of the data signal DATA_IN reduces the number of serial computations and the delays associated therewith. This reduction in time delay will become more readily apparent in the following FIGS. 4 and 5.

Figure 4:
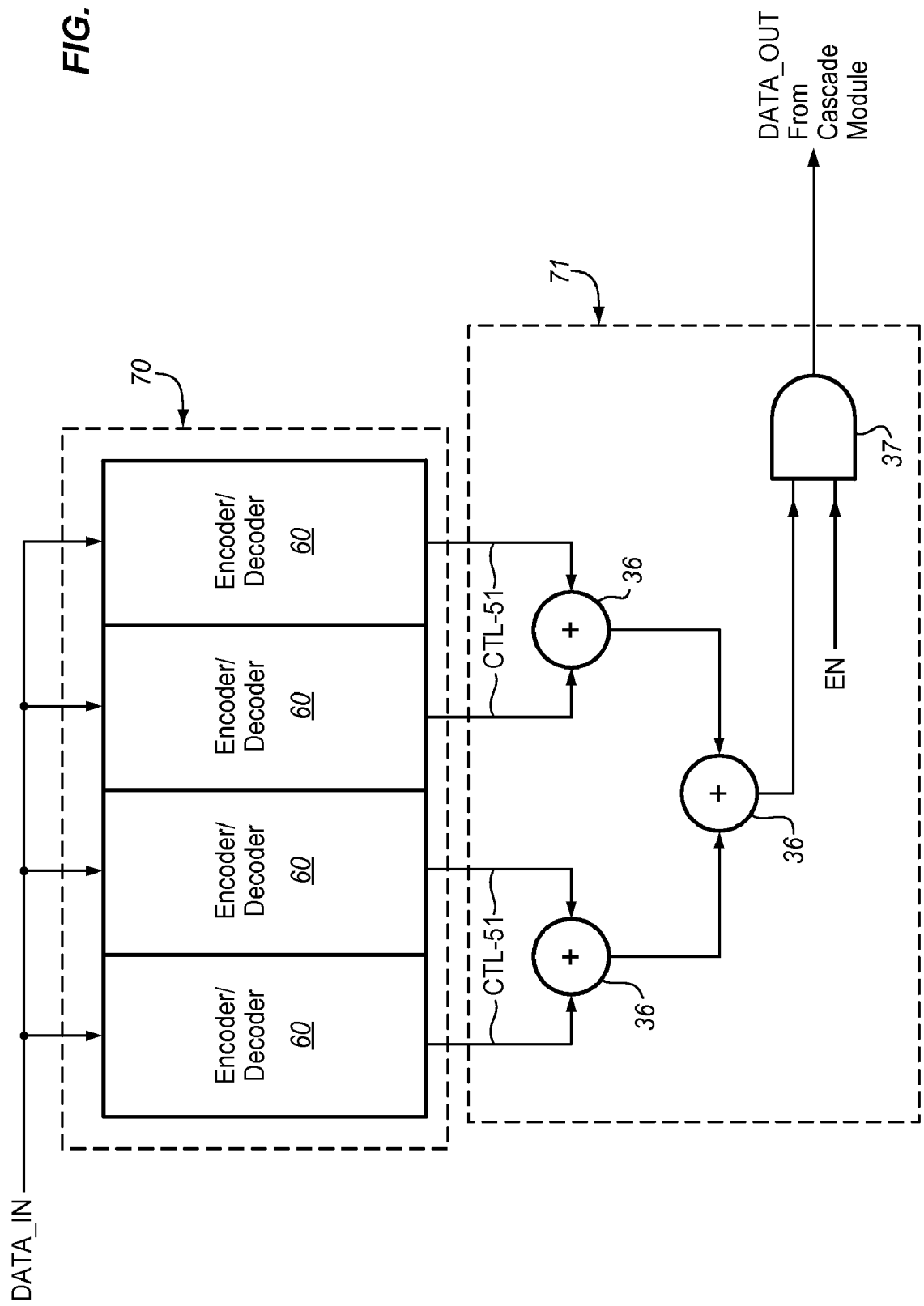
FIG. 4 is a block diagram of a block of encoder/decoder slices coupled to a cascade module in one exemplary embodiment of the invention.

FIG. 4 is a block diagram of a block 70 of encoder/decoder slices 60 coupled to a cascade module 71 in one exemplary embodiment of the invention. The control signals CTL-51 from the encoder/decoder slices 60 are transferred to a cascade module 71 that sums the control signals and forwards them onto a subsequent block 70 of encoder/decoder slices 60 when the block 70 is selected. The control signals CTL-51 are summed via adders 36 of the cascade module 71 and logically combined via an AND gate 37 of the cascade module 71 to provide input to a subsequent block 70 of encoder/decoder slices. The AND gate 37 also has an input for an enable signal EN that is used to forward the sum of the encoder/decoder slices 60 of the block 70 when desired. In other words, when additional blocks 70 of encoder/decoder slices 60 are required, the block 70 is enabled and its generated signal DATA_OUT is transferred to another already enabled block 70 of encoder/decoder slices 60 in the chain.

Figure 5:
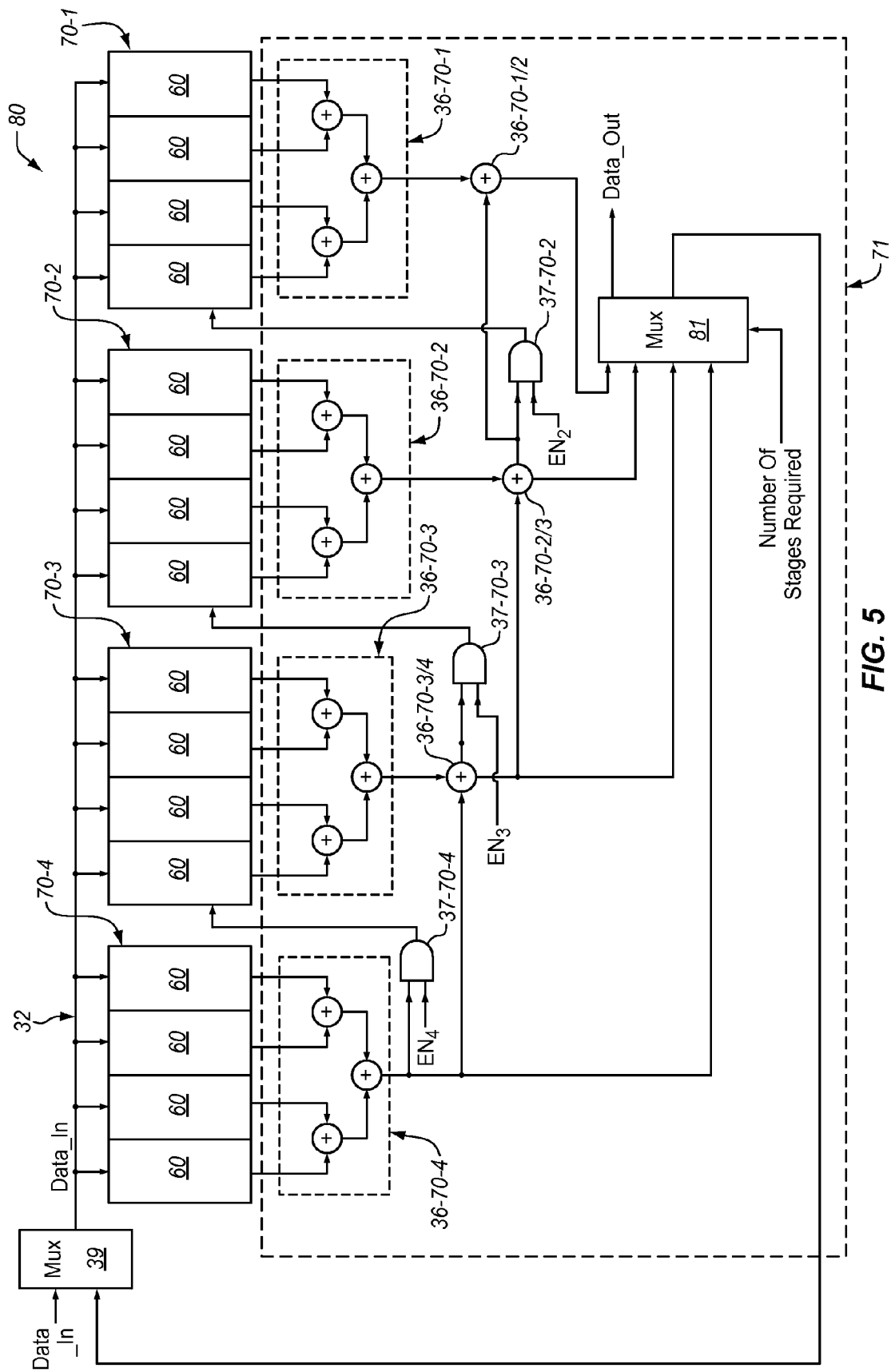
FIG. 5 is a block diagram of an error correction system with a cascade module in one exemplary embodiment of the invention.

FIG. 5 is a block diagram of an error correction system 80 with a cascade module 71 in one exemplary embodiment of the invention. In this embodiment, the error correction system 80 is configured as four blocks 70 of encoder/decoder slices 60 that form the basis of a composite encoder/decoder. Each block 70 is illustrated as having four encoder/decoder slices 60. Thus, the error correction system 80 as shown is configured with 16 encoder/decoder slices 60. In the prior art, the selection of 16 encoder/decoder slices would result in a time delay of $16 \cdot (37_{delay} + 36_{delay})$. In this embodiment, however, the four blocks 70 process the data signal DATA_IN from the multiplexer 39 in parallel. As mentioned in the description of FIG. 3, each block 70 of 4 encoder/decoder slices 60 has a delay of $3 \cdot (37_{delay}) + 4 \cdot (36_{delay})$. Since the blocks 70 process the data signal DATA_IN in parallel, the overall delay associated with selecting all four blocks 70 remains $3 \cdot (37_{delay}) + 4 \cdot (36_{delay})$.

To process the data signal DATA_IN in parallel, the error correction system 80 is configured with the cascade module 71. Since the error correction system 80, in this embodiment, is configured with four blocks 70, the cascade module 71 is expanded with additional adders 36 and AND gates 37 to accommodate the increased processing capability. While the additional adders 36 and AND gates 37 increase the overall logical delay of the error correction system 80 when all four blocks 70 are enabled (i.e., via multiplexer 81), the delay is still substantially less than the encoder/syndrome generator circuit 30 of FIG. 1 because the adders 36 and the AND gates 37 of the cascade module are also operated in parallel. For example, an implementation of the encoder/syndrome generator circuit 30 with 16 multiplier modules 50 yields a logical delay of $16 \cdot (37_{delay} + 36_{delay})$. The overall logical delay of this embodiment, on the other hand, is $3 \cdot (37_{delay}) + 4 \cdot (36_{delay})$ from the blocks 70 plus $1 \cdot (37_{delay}) + 4 \cdot (36_{delay})$ from the cascade module 71, which results in a savings of $8 \cdot (37_{delay})$ and $4 \cdot (36_{delay})$ as compared to the prior art encoder/syndrome generator circuit 30 of FIG. 1. The invention, of course, is not intended to be limited to an error correction system merely using four blocks 70 of encoder/decoder slices 60 for a total of 16 encoder/decoder slices 60. Rather, the blocks 70 may be configured with fewer or more encoder/decoder slices 60 as a matter of design choice. Moreover, the error correction system 80 may be configured with fewer or more blocks 70 than illustrated herein. In any case, the cascaded implementation of encoder/decoder blocks 70 results in an overall logical delay savings when compared to the prior art of FIG. 1 while remaining functionally equivalent in terms of error correction capabilities of an RS encoder/decoder.

With respect to the specific embodiment at hand, each control signal of the encoder/decoder slices 60 of each block 70 is transferred to the cascade module 71. The control signals of each block 70 are combined for selective application into other blocks 70. For example, the cascade module 71 includes a "tree structure" of adders 36 and AND gates 37 that are used to feed outputs of one block 70 of encoder/decoder slices 60 into another block 70 of encoder/decoder slices 60. The multiplexer 81 may be used to select, or "switch in", blocks 70 as desired based on the number of stages input to the multiplexer 81. To illustrate, the first block 70-1 of encoder/decoder slices 60 receives data from the bus 32 as conveyed from the multiplexer 39. These encoder/decoder slices 60 may also receive an input from a previous block 70-2 of encoder/decoder slices 60 operating in a manner similar to the encoder/decoder slices 60 of the block 70-1 when the block 70-2 is enabled with the enable signal $EN_2$. That is, the output of the adders 36-70-2 is transferred to the AND gate 37-70-2 where it is combined with an enable signal $EN_2$ that determines whether the computations of the block 70-2 are to be used. If so, the output of the adder 36-70-2/3 is transferred to the block 70-1 and to the MUX 81. The output of the adder 36-70-2/3 is also combined with the output of the adders 36-70-1 in the adder 36-70-1/2. The output of the adder 36-70-1/2 is also transferred to the MUX 81 to be multiplexed with the output of the adder 36-70-2/3. The MUX 81 outputs the multiplexed data as DATA_OUT and ultimately serves as the output of the error correction system 80.

The output of the adder 36-70-3/4 may be similarly combined with the enable signal $EN_3$ in the AND gate 37-70-3 and fed into the following block 70-2. The output of the adders 36-70-4 may also be combined with the enable signal $EN_4$ in the AND gate 37-70-4 and fed into the following block 70-3 as well as to the adder 36-70-3/4 and the MUX 81. As mentioned, the output of the adder 36-70-3/4 may also combined with the output of the adders 36-70-2 in the adder 36-70-2/3 and subsequently combined with the enable signal $EN_2$ in the AND gate 37-70-2 to be fed into the block 70-1. The output of the adder 36-70-3/4 may also be transferred to the multiplexer 81 as may the output from the adder 36-70-2/3. In this regard, the multiplexer 81 may multiplex the summed control signals CTL-51 of the blocks 70 that are enabled to generate a multiplexed encoder/decoder block signal that is fed into the multiplexer 39. For example, the control signals CTL-51 of the blocks 70-2, 70-3, and 70-4 are summed in their respective adders 36-70-2, 36-70-3, and 36-70-4 if enabled.

This structure allows for selectable error correction by selecting blocks 70 of encoder/decoder slices 60 as needed. Thus, when only 12 encoder/decoder slices 60 are required for encoding and/or decoding data, only the blocks 70-2, and 70-3 are enabled (block 70-1 being already enabled). In this regard, the portion of the cascade module 71 dedicated to the block 70-4 (i.e., the adders 36-70-4 and the AND gate 37-70-4) is not enabled and used in the ECC computation.

Regardless of the configuration, the parallel manner in which the data is processed by the blocks 70 via the cascade module 71 reduces the overall number of logical delays associated with the error correction system 80 when compared to the prior art of FIG. 1. And, because the overall delays of the error correction system 80 are less, the system 80 can be configured to provide longer codewords via additional blocks 70 and/or faster overall system operation.

FIG. 6 is a flow chart of a process 100 for providing error correction to data. The error correction may be used for encoding the data with check symbols for subsequent decoding at a receiving end. The error correction may also be used for decoding corrupted received data via generated error syndromes. Regardless of the encoding or decoding error correction of the data, a determination is made in the process element 101 regarding the level of error correction for the data. For example, if eight bits of error correction are required for the encoding of transmit data, then eight encoder/decoder slices may be selected to generate the check symbols used in encoding the transmit data. Similarly, if eight bits of error correction are required for the decoding of received corrupted data (i.e., because the received data was originally encoded with eight bits of error correction), then eight encoder/decoder slices may be selected to generate the error syndromes used to correct the corrupted data.

In response to determining the level of error correction required for the data, a number of encoder/decoder blocks is selected, in the process element 102. For example, the encoder/decoder blocks may each be configured with a plurality of encoder/decoder slices that are used in generating the check symbols and/or error syndromes. A selection of a single encoder/decoder block, therefore, results in the selection of multiple encoder/decoder slices. Thus, the number of encoder/decoder slices is greater than the number of encoder/decoder blocks selected. The encoder/decoder may generate control signals that allow for the encoder/decoder blocks to be cascaded and reduce the overall logical delay when compared to the prior art of FIG. 1 while maintaining the same error correction functionality.

With the encoder/decoder blocks selected, the data may be received in parallel by the encoder/decoder blocks, in the process element 103. Within each selected encoder/decoder block, the encoder/decoder slices may simultaneously latch the data and multiply the data with a preselected static value, or tap weight, in the process element 104. Within at least one selected encoder/decoder block, a plurality of control signals is generated by the encoder/decoder slices of the block, in the process element 105. Thereafter, the control signals are summed to provide a summed control signal, in the process element 106. This summed control signal is then multiplexed with the data, in the process element 107. The summed control signal is also transferred to at least one other selected encoder/decoder block, in the process element 108. For example, with two encoder/decoder blocks selected, a first encoder/decoder block may transfer the summed control signal to a second encoder/decoder block. This transfer of the summed control signal provides a break in the logical chain of encoder/decoder slices that reduces the multiplicative effect on the logical delay while maintaining the same error correction functionality of the prior art of FIG. 1.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An error correction system, comprising:
a composite encoder/decoder adapted to generate check symbols for encoding data and error syndromes for correcting corrupted data, wherein the error syndromes are adapted to correct the corrupted data by determining error locations and error values within the corrupted data, wherein the composite encoder/decoder module comprises a plurality of encoder/decoder slices, and wherein each encoder/decoder slice has a preselected static tap weight value for computing the check symbols and the error syndromes;

a cascade module adapted to couple the plurality of encoder/decoder slices into blocks of encoder/decoder slices, wherein a first block of encoder/decoder slices is selectively operable in parallel with a second block of encoder/decoder slices and wherein the number of encoder/decoder blocks is less than the number of encoder/decoder slices; and a switch adapted to select at least the first block of encoder/decoder slices to be used in computing the check symbols and the error syndromes.

2. The error correction system of claim 1, wherein the cascade module has a logical delay that is less than n times an adder delay of an encoder/decoder slice plus n times a gate delay of the encoder/decoder slice, wherein n is a total number of encoder/decoder slices selected in computing the check symbols and the error syndromes.

3. The error correction system of claim 1, wherein the encoder/decoder slices are adapted to generate control signals and wherein the cascade module includes a plurality of adders adapted to sum the control signals of the encoder/decoder slices.

4. The error correction system of claim 1, wherein the cascade module includes a multiplexer adapted to multiplex the summed control signals of the second encoder/decoder block with the summed control signals of a third encoder/decoder block to generate a multiplexed encoder/decoder block signal.

5. The error correction system of claim 4, further comprising a multiplexer adapted to multiplex the multiplexed encoder/decoder block signal with the data.

6. The error correction system of claim 1, wherein the cascade module is further adapted to couple an output of the first encoder/decoder block to an input of the second encoder/decoder block.

7. A method of providing error correction to data, the method comprising:
receiving data with a plurality of encoder/decoder blocks in parallel, wherein each encoder/decoder block includes a plurality of encoder/decoder slices;

within each encoder/decoder slice, latching the data and multiplying the latched data with a preselected static tap weight value to generate check symbols for encoding the data or error syndromes for correcting corrupted said data;

within each encoder/decoder slice of a first encoder/decoder block, generating a control signal in response to multiplying;

summing the control signals of the first encoder/decoder block; and transferring the summed control signals of the first encoder/decoder block to a second encoder/decoder block to encode the data or correct the corrupted said data.

8. The method of claim 7, further comprising selectively coupling a third encoder/decoder block to the first encoder/decoder block.

9. The method of claim 8, wherein selectively coupling a third encoder/decoder block comprises:
generating an enable signal; and
inputting the enable signal to a logic gate to couple the third encoder/decoder block to the first encoder/decoder block.

10. The method of claim 9, further comprising:
generating control signals with the third encoder/decoder block;
summing the control signals of the third encoder/decoder block; and
transferring the summed control signals of the third encoder/decoder block to the first encoder/decoder block.

11. The method of claim 10, further comprising multiplexing the summed control signals of the third encoder/decoder block with the summed control signals of the first encoder/decoder block to generate a multiplexed encoder/decoder block signal.

12. The method of claim 11, further comprising multiplexing the multiplexed encoder/decoder block signal with the data.

13. The method of claim 7, wherein said summing and transferring are performed using a plurality of logical devices that generate a logical delay that is less than n times an adder delay of an encoder/decoder slice plus n times a gate delay of the encoder/decoder slice, wherein n is a total number of encoder/decoder slices selected in computing the check symbols and the error syndromes.

14. A method of correcting errors in received data and encoding transmit data with error correction, the method comprising:
determining a level of error correction to be provided to the data;
selecting encoder/decoder blocks based on the determined level of error correction, wherein each encoder/decoder block comprises a plurality of encoder/decoder slices that are serially coupled to generate check symbols for encoding the transmit data and error syndromes for correcting corrupted received data;
receiving data with the selected encoder/decoder blocks;
generating a summed control signal with a first of the encoder/decoder blocks; and
transferring the summed control signal to a second of the at least two encoder/decoder blocks to encode the transmit data with the check symbols or to correct the corrupted received data with the error syndromes.

15. A method of correcting errors in received data and encoding transmit data with error correction, the method comprising:
selectively coupling a plurality of encoder/decoder blocks to receive data in parallel, wherein each encoder/decoder block includes a plurality of encoder/decoder slices;
within each encoder/decoder slice, latching the data and multiplying the latched data with a preselected static tap weight value to generate check symbols for encoding the data or error syndromes for correcting corrupted said data;
generating a control signal with a first encoder/decoder block in response to multiplying the latched data; and
transferring the control signal to a second encoder/decoder block to encode the transmit data with the check symbols or to correct the corrupted received data with the error syndromes.

16. The method of claim 15, wherein generating a control signal includes summing a plurality of outputs from the encoder/decoder slices of the first encoder/decoder block.

17. A transmitter for encoding data for transmission over a communication channel, the transmitter having an encoding system comprising:
an encoder adapted to generate check symbols for encoding data, wherein the encoder comprises a plurality of encoder slices, and wherein each encoder slice has a preselected static tap weight value for computing the check symbols;
a cascade module adapted to couple the plurality of encoder slices into blocks of encoder slices, wherein a first block of encoder slices is selectively operable in parallel with a second block of encoder slices and wherein the number of encoder blocks is less than the number of encoder slices; and
a switch adapted to select at least the first block of encoder slices to be used in computing the check symbols.

18. The transmitter of claim 17, wherein the encoder slices are adapted to generate control signals and wherein the cascade module includes a plurality of adders adapted to sum the control signals of the encoder slices.

19. A receiver for decoding received data from a communication channel, the receiver having an error correction system comprising:
a decoder adapted to generate error syndromes for correcting corrupted data received via the communication channel, wherein the error syndromes are adapted to correct the corrupted data by determining error locations and error values within the corrupted data, wherein the decoder comprises a plurality of decoder slices, and wherein each decoder slice has a preselected static tap weight value for computing the error syndromes;
a cascade module adapted to couple the plurality of decoder slices into blocks of decoder slices, wherein a first block of decoder slices is selectively operable in parallel with a second block of decoder slices and wherein the number of decoder blocks is less than the number of decoder slices; and
a switch adapted to select at least the first block of decoder slices to be used in computing the error syndromes.

20. The receiver of claim 19, wherein the decoder slices are adapted to generate control signals and wherein the cascade module includes a plurality of adders adapted to sum the control signals of the decoder slices.

* * * * *